(12) United States Patent
Tsuzuki

(10) Patent No.: US 7,436,450 B2
(45) Date of Patent: Oct. 14, 2008

(54) LINEAR IMAGE SENSOR

(75) Inventor: Takao Tsuzuki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 643 days.

(21) Appl. No.: 11/094,230

(22) Filed: Mar. 31, 2005

(65) Prior Publication Data

US 2005/0225663 A1 Oct. 13, 2005

(30) Foreign Application Priority Data

Apr. 13, 2004 (JP) ............................ 2004-117962

(51) Int. Cl.
*H04N 5/235* (2006.01)
*H04N 5/335* (2006.01)
(52) U.S. Cl. ...................... 348/362; 348/294
(58) Field of Classification Search ................ 348/296, 348/297, 324, 362, 273, 274, 518; 358/482, 358/483, 514; 250/208.1
See application file for complete search history.

(56) References Cited

U.S. PATENT DOCUMENTS 6,002,497 A * 12/1999 Hirama ....................... 358/514
6,028,299 A * 2/2000 Hirama et al. ............ 250/208.1
6,576,938 B1 * 6/2003 Hirama et al. .............. 257/233

FOREIGN PATENT DOCUMENTS

| JP | 60-120557 A | 6/1985 |
| JP | 09-205520 A | 8/1997 |
| JP | 2000-32216 A | 1/2000 |

* cited by examiner

*Primary Examiner*—Tuan Ho
*Assistant Examiner*—Trung Diep
(74) *Attorney, Agent, or Firm*—Sughrue Mion, PLLC

(57) ABSTRACT

A linear image sensor, comprises a first and second gate/shutter arrays in which a plurality of the read gates and of the shutter structure sections are alternately disposed, a light-receiving element array which is disposed between the first and second gate/shutter arrays and in which a plurality of the light-receiving elements are arranged in line, a first charge transfer section which transfers a signal charge which is read out through the read gate of the first gate/shutter array, and a second charge transfer section which transfers a signal charge which is read out through the read gate of the second gate/shutter array.

12 Claims, 7 Drawing Sheets

LINEAR IMAGE SENSOR

BACKGROUND OF THE INVENTION

1. Field of the Invention

The present invention relates to a linear image sensor, and particularly to a linear image sensor with a shutter function.

2. Description of the Related Art

In a color linear image sensor in which a linear image sensor is used, conventionally, a plurality of linear image sensors are disposed. A plurality of image sensors correspond to different colors respectively. Generally, different color filters (for example, GREEN, BLUE, and RED) correspond to the respective linear image sensors in the arrays. A plurality of light-receiving elements, such as photodiodes, are disposed in lines on a semiconductor substrate in the linear image sensor in each array. The plurality of light-receiving elements correspond to each pixel. In such linear image sensor, signal charges that are photoelectrically converted by the light-receiving elements are sequentially transferred, whereby image signals corresponding to the respective pixels are sequentially outputted.

In a color linear image sensor that has a shutter function, the exposure is set for color filters with different colors respectively. In general, the exposure setting is performed by providing the linear image sensor in each array with a shutter gate and a shutter drain. Appropriate image data for each color can be obtained by this exposure setting.

The conventional structure of a linear image sensor is such that one side of an array of light-receiving elements of the image sensor is provided with a shutter gate and a shutter drain, and that the other side of same is provided with a charge reading section and a charge transfer section. Since the speed of the linear image sensor increases, there was a problem that the read time becomes long when reading out signals from the one side only. In order to respond to higher speed of the sensors, there has been proposed in the conventional linear image sensor a system in which two charge transfer sections are provided so as to hold therebetween the arrays of light-receiving elements and use the two charge transfer sections to read out signal charges. However, a shutter structure could not be provided to this system, thus it was difficult to achieve high quality picture.

For such technology, there is described a technology in Japanese Unexamined Patent Application Publication No. 2000-32216. In the technology described in Japanese Unexamined Patent Application Publication No. 2000-32216, one side of an array of light-receiving elements is provided with first and second charge transfer sections in parallel. By using this structure, the first charge transfer section near the array of light-receiving elements receives signal charges generated in the odd-numbered pixels, and the second charge transfer section which is far from the array of light-receiving elements receives signal charges generated in the even-numbered pixels, so as to respond to higher speed. On the other hand, in order to prevent increase of a line-to-line distance that is caused by providing a shutter structure section to each linear sensor, first to third linear image sensors having different sensitivities for incident light are disposed from the outer side in the order of highest sensitivity with respect to the incident light, and further a shutter gate and a shutter drain, which adjust the exposure for the only linear image sensor having the highest sensitivity for the incident light on the side where light comes, are provided. Such technology is also disclosed in Japanese Unexamined Patent Application Publication No. 9-205520.

Japanese Unexamined Patent Application Publication No. 60-120557 describes a solid-state image sensing device which has a structure to suppress a blooming.

When achieving high speed of the linear image sensor as described above, it was difficult to pursue a higher-quality picture.

SUMMARY OF THE INVENTION

According to the first aspect of the present invention, a linear image sensor, comprises a read gate which reads out a signal charge of a light-receiving element, a shutter structure section which controls an accumulated charge of the light-receiving element, a first gate/shutter array in which a plurality of the read gates and of the shutter structure sections are alternately disposed, a second gate/shutter array in which the read gates and the shutter structure sections are alternately disposed in the order that is different from the order in the first gate/shutter array, a light-receiving element array which is disposed between the first and second gate/shutter arrays and in which a plurality of the light-receiving elements are arranged in line, a first charge transfer section which transfers a signal charge which is read out through the read gate of the first gate/shutter array and a second charge transfer section which transfers a signal charge which is read out through the read gate of the second gate/shutter array.

According to the second aspect of the present invention, a color linear image sensor comprises a first linear image sensor and a second linear image sensor. The first linear image sensor comprises a first gate/shutter array in which a plurality of read gates and of shutter structure sections are alternately disposed, a second gate/shutter array in which the read gates and the shutter structure sections are alternately disposed in the order that is different from the order in the first gate/shutter array, a light-receiving element array which is disposed between the first and second gate/shutter arrays and in which a plurality of the light-receiving elements are arranged in line, a first charge transfer section which transfers a signal charge which is read out through the read gate of the first gate/shutter array and second charge transfer section which transfers a signal charge which is read out through the read gate of the second gate/shutter array. The second linear image sensor comprises a third gate/shutter array in which a plurality of the read gates and of the shutter structure sections are alternately disposed, a fourth gate/shutter array in which the read gates and the shutter structure sections are alternately disposed in the order that is different from the order in the third gate/shutter array, a light-receiving element array which is disposed between the third and fourth gate/shutter arrays and in which a plurality of the light-receiving elements are arranged in line, a third charge transfer section which transfers a signal charge which is read out through the read gate of the third gate/shutter array and a fourth charge transfer section which transfers a signal charge which is read out through the read gate of the fourth gate/shutter array. The shutter structure sections of the first linear image sensor is controlled based on a first shutter signal, and the shutter structure sections of the second linear image sensor is controlled based on a second shutter signal.

According to the third aspect of the present invention, a color linear image sensor comprises a first linear image sensor and a second linear image sensor. The first linear image sensor comprises a first gate/shutter array in which a plurality of read gates and of shutter structure sections are alternately disposed, a second gate/shutter array in which the read gates and the shutter structure sections are alternately disposed in the order that is different from the order in the first gate/ shutter array, a first light-receiving element array which is disposed between the first and second gate/shutter arrays and in which a plurality of the light-receiving elements are arranged in line, a first charge transfer section which transfers a signal charge which is read out through the read gate of the first gate/shutter array, and a second charge transfer section which transfers a signal charge which is read out through the read gate of the second gate/shutter array. The second linear image sensor comprises a second light-receiving element array in which a plurality of the light-receiving elements are arranged in line, a third and fourth charge transfer sections disposed at one side of the second light-receiving element array, and a shutter structure sections disposed at opposite side of the third and fourth charge transfer sections.

BRIEF DESCRIPTION OF THE DRAWINGS

The above and other objects, advantages and features of the present invention will be more apparent from the following description taken in conjunction with the accompanying drawings, in which.

PREFERRED EMBODIMENT OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiment 1 of the Invention

Figure 1:
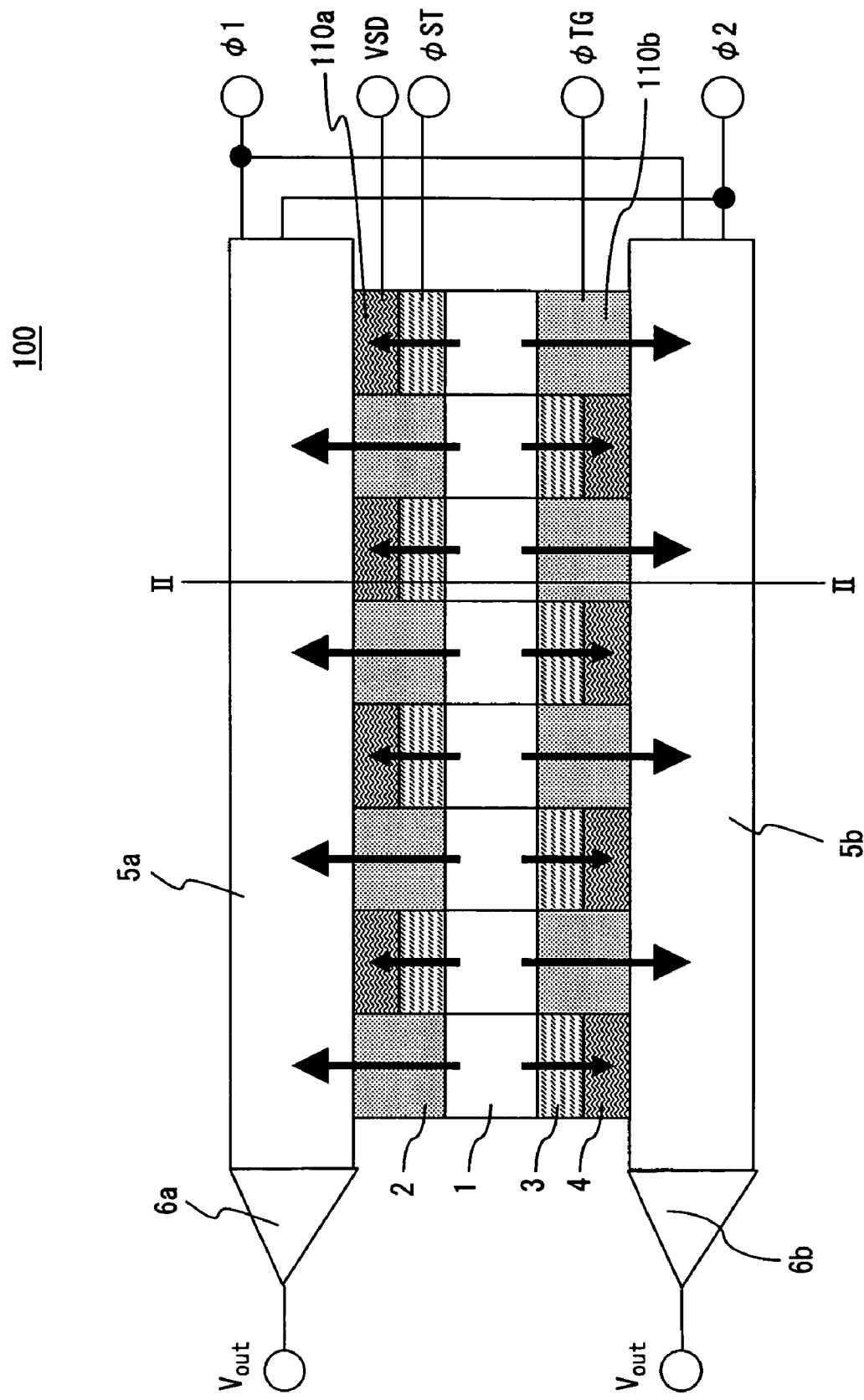
FIG. 1 shows a top view of the linear image sensor of Embodiment 1.
Figure 2:
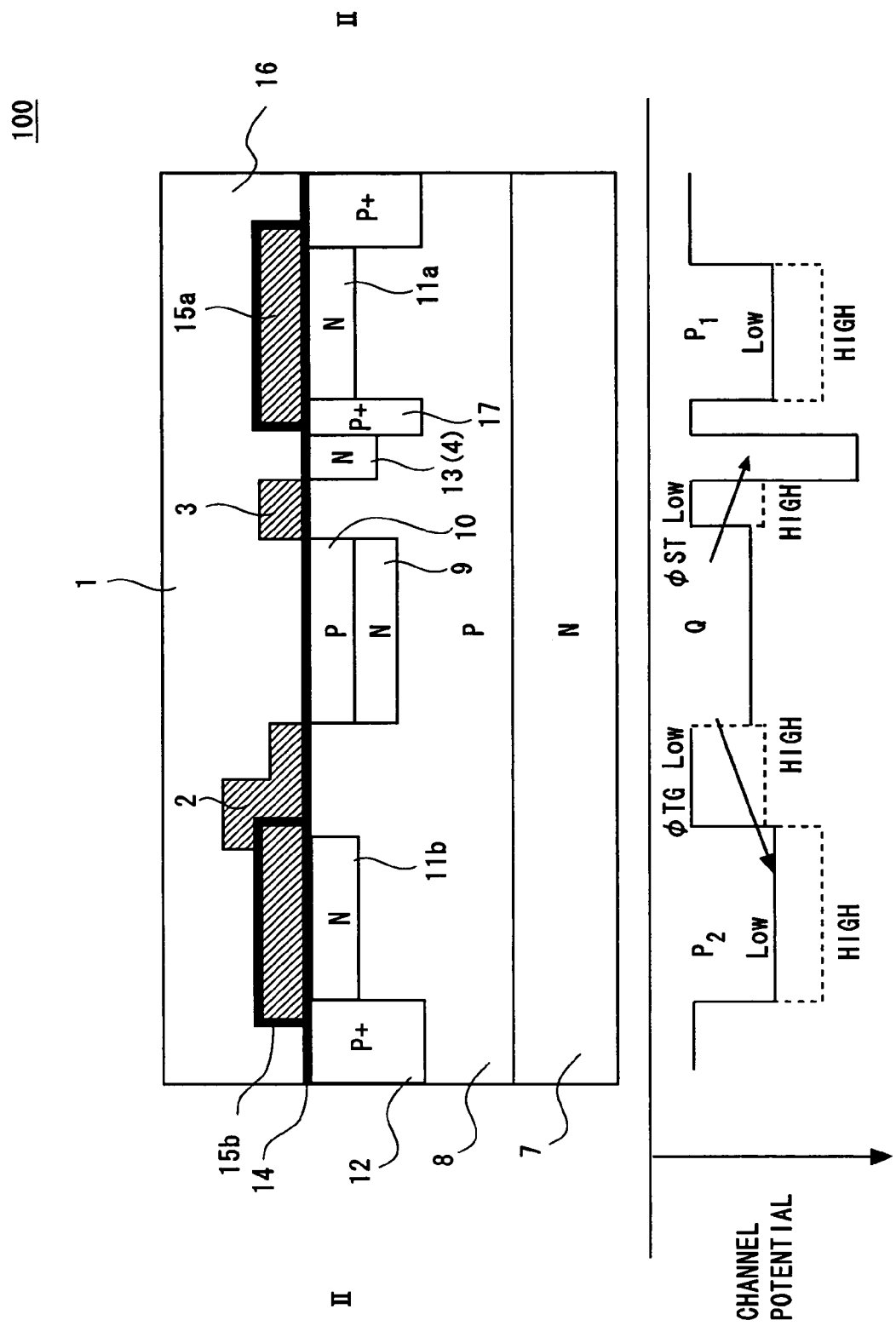
FIG. 2 shows a cross sectional view of the linear image sensor along II-II of FIG. 1.
Figure 3:
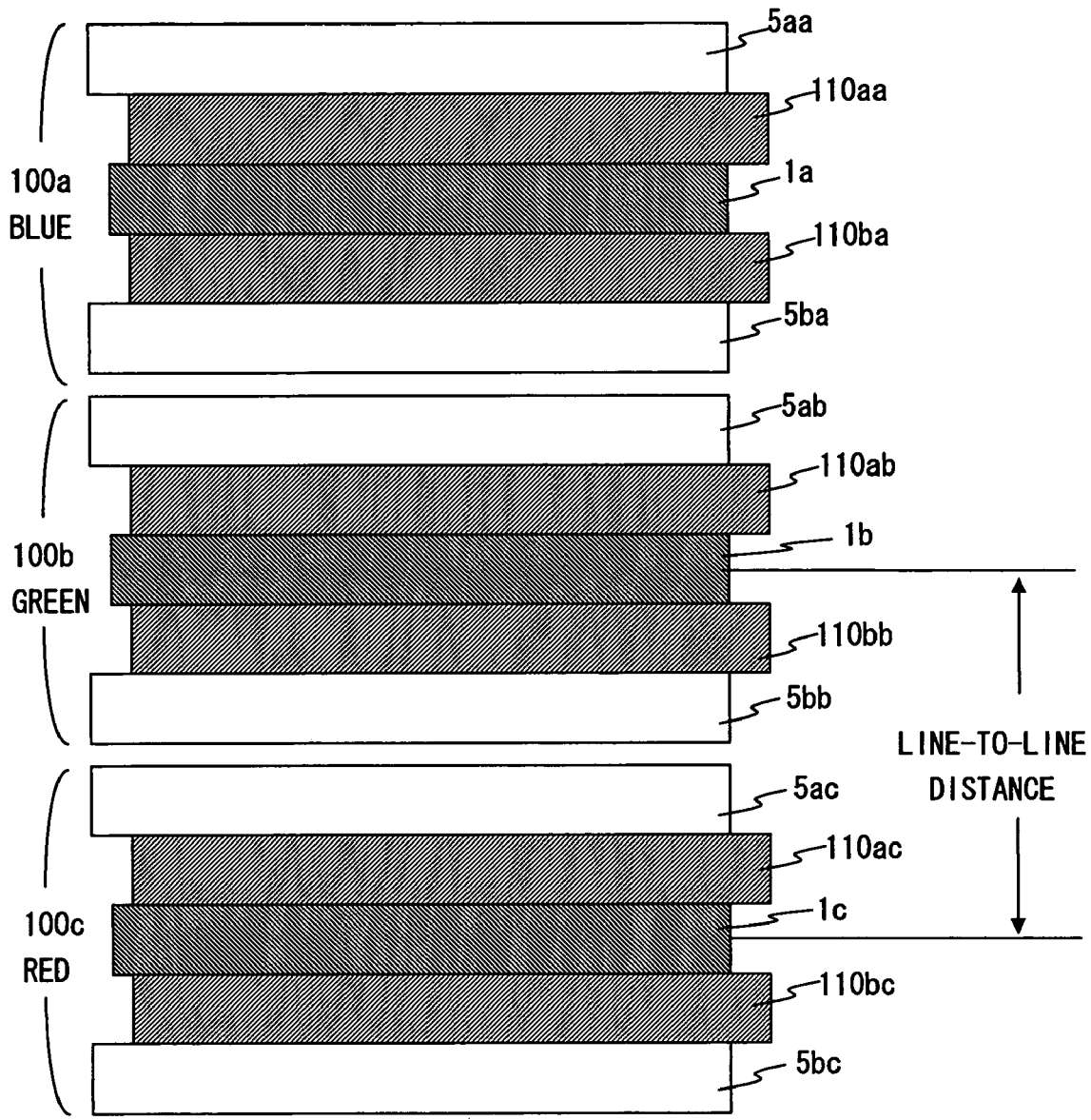
FIG. 3 shows a top view of the color linear image sensor which has three image sensors shown in FIG. 1.

Here in below, a linear image sensor according to Embodiment 1 of the present invention will now be described in detail with reference to the drawings. FIG. 1 shows a top view of an array of a linear image sensor 100 of Embodiment 1. FIG. 2 shows a cross-sectional view taken along a line II-II of the linear image sensor 100 of FIG. 1. FIG. 3 shows a top view of a configuration of a color linear image sensor obtained by disposing three of the linear image sensor 100 shown in FIG. 1 in arrays in parallel in a vertical direction in the figure. As can be seen in FIG. 3, this color linear image sensor has a configuration in which the linear image sensors 100 with the same configuration are arranged in parallel.

The configuration of an array of the linear image sensor 100 will now be described hereinbelow using FIG. 1. As shown in FIG. 1, this linear image sensor 100 comprises a light-receiving element array 1, read gate 2, shutter gate 3, shutter drain 4, first charge transfer section 5a, second charge transfer section 5b, first output circuit 6a, and second output circuit 6b.

The light-receiving element array 1 has a plurality of light-receiving elements disposed in a line. The individual light-receiving elements in the light-receiving element array 1 output signal charges corresponding to respective pixels of an image. The read gate 2 is a gate for reading out the signal charge of the light-receiving element to the charge transfer section 5a and 5b in response to a read signal. The shutter gate 3 and the shutter drain 4 constitute a shutter structure section for executing a shutter operation of the linear image sensor 100 in response to a shutter signal. A constant voltage VSD is applied to the shutter drain to evacuate charges. The shutter operation will hereinafter be described. The first and second charge transfer sections 5a and 5b transfer signal charges that are read out through the read gate 2 to the output circuits 6a and 6b sequentially. The output circuits 6a and 6b are circuits composed of an analog circuit, such as a source follower, inverter or the like. The output circuits 6a and 6b includes a signal charge detection section which converts a signal charge into signal voltage, the signal charge detection section is made of a floating diffusion region. The output circuits 6a and 6b output the signal charge transferred from the charge transfer sections 5a and 5b as output voltage.

As shown in FIG. 1, with respect to the odd-numbered light-receiving elements from the left of the figure, the read gate 2 is disposed between the light-receiving element array 1 and the first charge transfer section 5a, and the shutter gate 3 and the shutter drain 4 are disposed between the light-receiving element array 1 and the second charge transfer section 5b. With respect to the even-numbered light-receiving elements from the left of FIG. 1, the shutter gate 3 and the shutter drain 4 are disposed between the light-receiving element array 1 and the charge transfer section 5a, and the read gate 2 is disposed between the light-receiving element array 1 and the charge transfer section 5b.

In other words, on one side of the light-receiving element array 1 (upper side in FIG. 1), there is disposed a first gate/shutter array 110a in which the read gate 2 and the shutter structure section are alternately formed for each light-receiving element. The charge transfer section 5a can transfer signal charges provided via the read gate 2 of the first gate shutter array 110a. On the other side of the light-receiving element array 1 (lower side in FIG. 1), there is disposed a second gate/shutter array 110b in which the read gate 2 and the shutter structure section are alternately formed for each light-receiving element in the order that is different from the order in the opposite side. The charge transfer section 5b can transfer signal charges provided via the read gate 2 of the second gate/shutter array 110b. The linear image sensor 100 of Embodiment 1 can be said to have a structure in which the light-receiving element array 1 is disposed between the first gate/shutter array 11a and the second gate/shutter array 110b, and the light-receiving element array 1, first gate/shutter array 110a, and second gate/shutter array 110b are disposed between the first charge transfer section 5a and the second charge transfer section 5b.

FIG. 2 shows a cross-sectional structure of the linear image sensor 100 corresponding to an even-numbered pixel from the left of the FIG. 1. As shown in FIG. 2, the linear image sensor 100 is formed in a P-well 8 which is formed on an N-type substrate 7. A P-type region and an N-type region respectively corresponding to the elements are formed in the P-well 8. A thermal oxide layer 14 is formed on the surface of the substrate that includes these diffusion regions. Further, an intermediate insulating layer 16 is formed on the entire surface of the substrate that includes the thermal oxide film 14, read gate 2, charge transfer sections 5a and 5b, and the like.

As can be seen in FIG. 2, the light-receiving element array 1 is formed with a photodiode having a PN junction. Specifically, the N-type region 9 is formed by introducing N-type impurities onto the P-well 8. Further, the P-type region 10 is formed in a part that is close to the surface of the substrate on the N-type region 9. The N-type region 9 and P-type region 10 form the photodiode.

In FIG. 2, on the left side of the light-receiving element array 1 (lower side in FIG. 1), the read gate 2 composed of polysilicon is formed on the P-well 8 with the thermal oxide film 14 therebetween. An electrode for charge transfer 15b composed of polysilicon is formed on the left side of the read gate 2. The read gate 2 and the charge transfer electrode 15b are formed in a state where portions thereof are stacked on the substrate. The thermal oxide film 14 is formed between the read gate 2 and the charge transfer electrode 15b, thereby insulating them from each other.

An N-type region 11b is formed in the vicinity of the surface of the P-well 8 that corresponds to the lower part of the charge transfer electrode 15b. The second charge transfer section (CCD shift register) 5b is formed with the charge transfer electrode 15b and the N-type region 11b. The far-left region of the P-well 8 on the further left from the charge transfer electrode 15b is provided with P+ region 12 as a channel stop region.

In FIG. 2, on the right side of the light-receiving element array 1 (upper side in FIG. 1), the shutter gate 3 composed of polysilicon is formed on the P-well 8 with the thermal oxide film 14 therebetween. An N-type region 13 is formed in the vicinity of the substrate surface of the P-well 8 that corresponds to the right side of the shutter gate 3. This N-type region 13 forms the shutter drain 4. A P+ region 17 as a channel top layer is formed on the right side of the shutter drain 4. On the right side of the P+ region 17, which is a channel stop layer, there are an N-type region 11a and the charge transfer electrode 15a of polysilicon which is formed on the N-type region 11a with the thermal oxide film 14 therebetween. The first charge transfer section 5a is formed with the charge transfer electrode 15a and the N-type region 11a. As with the far left of the P-well 8, the P+ region 12 as a channel stop layer is formed on the far right on the right side of the charge transfer section 5a. Note that although FIG. 2 illustrates the cross section of the region corresponding to one of the even-numbered light-receiving elements from left of FIG. 1, the region corresponding to one of the odd-numbered light-receiving elements is symmetrical and has the same structure.

As can be seen in the structures of FIG. 1 and FIG. 2, the linear image sensor 100 has a configuration in which the shutter gate 3 and the read gate 2 are alternately disposed on the odd-numbered and even-numbered light-receiving elements. The read gate 2 and the shutter structure section (shutter gate 3 and shutter drain 4) are alternately disposed for each light-receiving element between the light-receiving element array 1 and the first charge transfer section 5a. The read gate 2 and the shutter structure section are alternately disposed between the light-receiving element array 1 and the second charge transfer section 5b of the linear image sensor 100 in the order that is different from the order between the light-receiving element array 1 and the first charge transfer section 5a.

FIG. 3 shows a color linear image sensor in which such an array of the linear image sensor 100 as described above is disposed in parallel as a first linear image sensor 100a, a second linear image sensor 100b, and a third linear image sensor 100c. In FIG. 3, the linear image sensor 100a corresponds to BLUE, 100b to GREEN, and 100c to RED. Note that, as shown in FIG. 1, a read signal ΦTG for driving each read gate 2, and a shutter signal ΦST for driving each shutter gate are supplied to the individual linear image sensor. Transfer signals Φ1 and Φ2 for controlling transfer are supplied to the charge transfer sections 5a and 5b.

Figure 4:
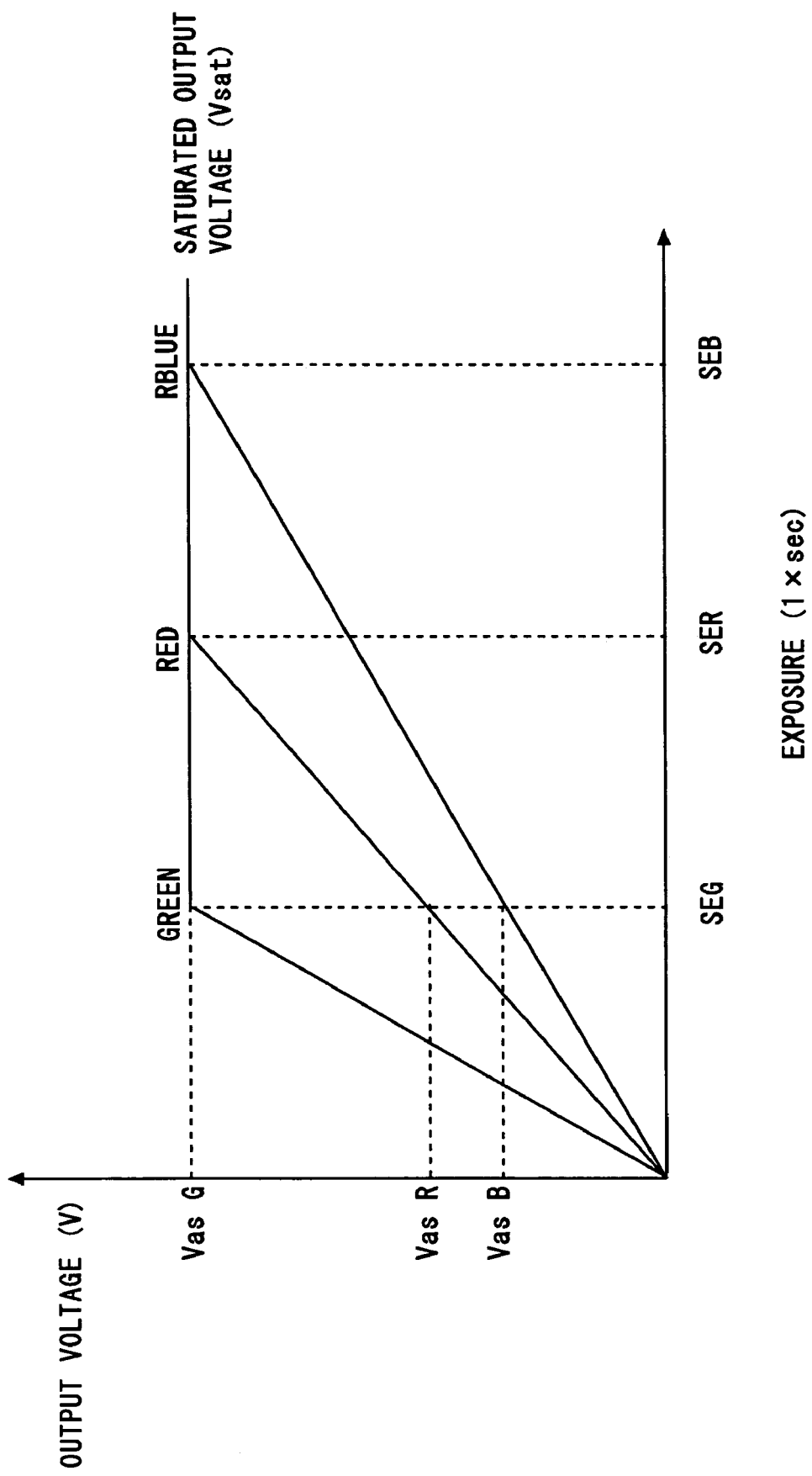
FIG. 4 shows a relationship between exposure and signal output level.

Each linear image sensor 100 in the above-described color linear image sensor has a shutter structure section (shutter gate 3 and shutter drain 4) for executing the shutter function. Now, FIG. 3 and FIG. 4 are used to describe the significance of executing the shutter function by means of the shutter structure section.

As was shown in FIG. 3, when configuring the color linear image sensor formed by disposing the linear image sensors 100a, 100b, and 100c in three arrays in parallel on a semiconductor substrate, and mounting color filters with different colors (BLUE, GREEN, and RED) on the respective light-receiving element arrays 1, it is necessary to adjust the exposure (the product of the amount of light incident on the photodiode and the accumulation time) for each color.

One of the characteristics for determining the performance of the linear image sensor 100 is saturation output voltage. In general, an output signal voltage of the linear image sensor 100 is proportional to the exposure (the product of the amount of light incident on the light-receiving section and the accumulation time). However, at a certain output signal voltage or above, even if the exposure increases, the output signal voltage does not increase. This value is called "saturation output voltage (Vsat)" (the exposure that produces saturation output voltage is called "saturation exposure".). The larger this value, the larger a signal voltage amplitude becomes, and the larger a dynamic range (the ratio between the saturation exposure and noise, or a dark output, for example) becomes. Therefore, it is required that the saturation output voltage be as large as possible for the linear image sensor 100.

In the case of the above-described color linear image sensor, since the color filters are formed on the three arrays of the linear image sensors 100a to 100c, saturation output voltages of the respective linear image sensors 100a to 100c are equal for the three colors RGB unless the sizes of the light-receiving element 1 and charge transfer sections 5a and 5b, or the maximum signal voltage amplitudes of the respective output circuits 6a and 6b are purposefully changed.

Further, since the saturation output voltage for the linear image sensor 100 is preferably as large as possible as described above, it is natural that the saturation output voltages for the three colors be equal. However, in the case of the color linear image sensor as above, the sensitivities of the RGB outputs (output signal voltages/exposures) for the three colors are normally not equal. Moreover, even if the sensitivities of the RGB outputs under a certain light source are the same, when the light source to be used is changed, it is not always true that the sensitivities of the RGB outputs become the same. Therefore, generally the relationship between the exposure and the signal output voltage of the color linear image sensor is as shown in FIG. 4. FIG. 4 shows the case in which, among the RGB outputs, GREEN has the largest sensitivity, and BLUE has the smallest sensitivity. As can be seen in FIG. 4, the outputs other than that of the GREEN with the largest sensitivity can use the output values only up to VsaR and VsaB respectively, although the saturation output voltages of the RGB outputs are essentially equal. It is because when using the color linear image sensor where a saturation exposure of SEG (exposure that produces the saturation output voltage of the GREEN output) is exceeded, the GREEN output exceeds a saturation output voltage VsaG, and normal image data for the GREEN cannot be obtained. Alternatively, signal charges that overflow in the light-receiving element section 1*b* and charge transfer sections 5*ab* and 5*bb* of the linear image sensor 100*b* which outputs a signal corresponding to the GREEN may possibly flow into the light-receiving element sections 1*a* and 1*c* and charge transfer sections 5*aa* and 5*ac* of the other two linear image sensors (100*a*, 100*c*), whereby the colors are mixed. In either case, since for the substantial saturation output voltage, the GREEN has the largest and the BLUE has the smallest in this example, the dynamic range is different for each color, thereby affecting the image quality.

When the shutter structure section is used, the accumulation time can be controlled for each color with the same amount of light. In other words, a light-receiving element, i.e. the accumulation charge of a light-receiving element, which has reached the saturated output voltage by controlling the shutter gate 3 on the basis of the characteristics or the like of the color filter, can be discharged to the shutter drain 4. By changing the timing for controlling the shutter gate 3 on the basis of the exposure where the saturation output voltage is reached for each color, it is possible to obtain a large dynamic range for each linear image sensor 100 in the color linear image sensor where a plurality of linear image sensors 100 are arranged.

Figure 5:
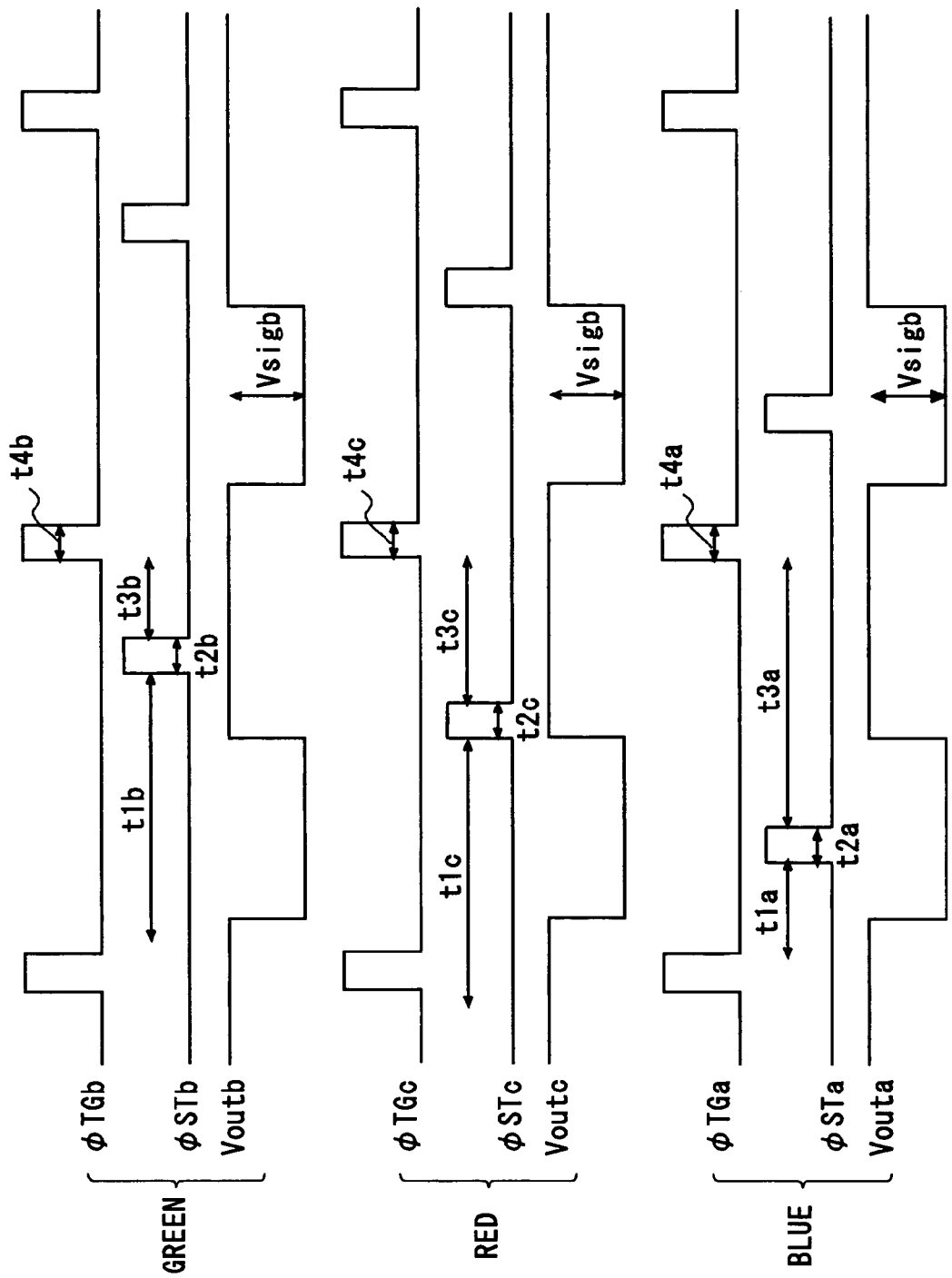
FIG. 5 shows a relationship among a read signal, a shutter signal, and a output voltage.

FIG. 5 shows a drive method as an example of the color linear image sensor having characteristics of the saturation output voltage shown in FIG. 4. FIG. 5 is a figure that illustrates the relationship among a read signal, shutter signal and output voltage that are supplied to each linear image sensor. Further, FIG. 2 shows a state of a channel potential and a state of a signal charge Q conforming to the cross sectional structure. A specific shutter operation is described hereinbelow using FIG. 2 and FIG. 5. With the method described hereinbelow, suitable exposures can be obtained for the three colors by adjusting a shutter signal for the shutter gate 3 of each color, and even a saturation output voltage that is common in the three colors can be used.

In the operation described below, pulsing read signals ΦTGa, ΦTGb and ΦTGc, and pulsing shutter signals ΦSTa, ΦSTb and ΦSTc shown in FIG. 5 are provided to the element corresponding to FIG. 2 for each linear sensors 100*a*, 100*b*, and 100*c*.

(1) Accumulation of Signal Charge

When the shutter signal ΦSTb supplied to the shutter gate 3*b* and the read signal ΦTGb supplied to the read gate 2*b* are both at a low level (t1*b* period in FIG. 5), a signal charge of the GREEN is accumulated. Similarly, when the pulses ΦSTc and ΦTGc, as well as the pulses ΦSTa and ΦTGa are both at low levels in the linear image sensors 100*a* and 100*c* corresponding to RED and BLUE (t1*c* and t1*a* periods in FIG. 2), signal charges of BLUE and RED are accumulated.

(2) Discharge of Signal Charge

When the read signal ΦTGb is still at a low level and when the shutter signal ΦSTb is at a high level (t2*b* period in FIG. 2), a light-receiving element 1*b* and a shutter drain 4*b* enter a conduction state. Accordingly, a signal charge Qb in the light-receiving element 1*b* is discharged to the shutter drain 4*b*, and the charge of the light-receiving section 1*b* becomes zero. Note, at this time, that the charge which is accumulated in an odd-numbered light-receiving element from the left in FIG. 1 discharges a charge to the shutter drain on the lower side of FIG. 1. The charge which is accumulated in an even-numbered light-receiving element from the left in FIG. 1 discharges a charge to the shutter drain on the upper side of FIG. 1. (See the arrows in FIG. 1)

Thereafter, when the read signal ΦTGb and the shutter signal ΦSTb are brought to low levels again, accumulation of the signal charge is restarted (t3*b* period in FIG. 5). Similarly, when the read signals ΦTGa and ΦTGc are still at the low levels and the shutter signals ΦSTa and ΦSTc are at the high levels in parts corresponding to the BLUE and RED (t2*a* and t2*c* periods in FIG. 5), the signal charges Qa and Qc are discharged to the shutter drains 4*a* and 4*c*, and the charges of the light-receiving elements 1*a* and 1*c* become zero. Note that the timing when the shutter signals ΦSTa and ΦSTc are brought to high levels can be determined on the basis of the characteristics of the linear image sensor 100, and thus can be determined independently for each linear image sensor 100*a*, 100*b* and 100*c*. Then, when the pulse ΦTGa and pulse ΦSTa, and the pulse ΦTGc and ΦSTc are brought to low levels, a signal charge is accumulated (t3*a* and t3*c* period in FIG. 5).

(3) Reading out Signal Charge

When the read signal ΦTGb is brought to a high level in a state where the shutter signal ΦSTb is on the low level (t4*b* period in FIG. 5), the signal charge Qb of the GREEN is sent to the second charge transfer section 5*bb* of the linear image sensor 100*b* via the read gate 2*b*. Note, at this time, that the charge accumulated in the odd-numbered light-receiving element from the left in FIG. 1 transfers the signal charge to the charge transfer section 5*ab* on the upper side of FIG. 1. Thereafter, the signal charge is outputted to the outside from the second charge transfer section 5*bb* through a second output circuit 6*bb*. This outputted signal is shown as VsigB in FIG. 5. Similarly, when the shutter signals ΦSTa and ΦSTc are brought to low levels and the read signals ΦTGa and ΦTGc are brought to high levels, the signal charges Qa and Qc of BLUE and RED are outputted respectively from the charge transfer sections via the output circuit.

As described above in detail, in the first to third linear image sensors 100*a*, 100*b* and 100*c* in Embodiment 1, a signal charge that is generated in an odd-numbered pixel from the far left in FIG. 1 among the signal charges generated in the light-receiving element array 1 is transferred to the charge transfer section 5*a* in the upper part of FIG. 1, while a signal charge that is generated in an even-numbered pixel is transferred to the transfer section 5*b* in the lower part (See the arrows in FIG. 1). Such sorted signal charges are sequentially transferred to the output circuits 6*a* and 6*b* by the two-layer driven charge transfer sections 5*a* and 5*b* (CCD shift register) for the transfer signals Φ1 and Φ2. Therefore, the signal charge can be transferred at high speed.

For signal charges corresponding to the respective colors, the timing for discharging the charges of the light-receiving elements by the respective colors can be controlled by the shutter structure that each linear image sensor 100*a*, 100*b* and 100*c* has. In other words, the exposure (accumulated charge) is controlled independently for each color. Therefore, a higher quality picture for the color linear image sensor can be realized.

In the color linear image sensor having a plurality of arrays of linear image sensors 100 as described above, it is necessary to obtain a plurality of arrays of information about an image in a predetermined place on an object. For this reason, it is necessary to externally store the information from when a first light-receiving element array 1 scans a predetermined place on the object until when a second light-receiving element array 1 scans the predetermined place on the object and arrange the information to perform signal processing. Thus, external memory is required. The size of this required external memory depends on the line-to-line distance between the light-receiving element arrays of adjacent linear image sensors 100.

The required/necessary memory size will now be described using the line-to-line distance in a conventional technology and the line-to-line distance in the present embodiment. A scanner with a high-resolution color linear image sensor, and a linear image sensor with 10600 pixels class which is used in a copy machine perform mechanical scan with the linear image sensor in a vertical direction (feed direction) with respect to the arranging direction (main scanning direction of the light-receiving element array. In this case, if the gray scale (gradation from black to white) is 12 bits, the required memory size is as shown in the formula below:

$$C = 10600 \times 12 \times (M+1) \text{ bits} \quad (1)$$

Here, M represents the line-to-line distance of the two light-receiving element arrays by the number of scans.

For example, when considering the case where charge transfer sections are provided on both sides of the conventional light-receiving element array but no shutter structure section exists, in this case, component parts to be disposed in the line-to-line distance are two arrays of charge transfer sections, two arrays of read gates, one array of element separation region and of light-receiving element array. Here, for example, when the width of the array of the charge transfer section is 10 μm, the width of the read gate is 4 μm, the width of the element separation region is 2 μm, and the width of the light-receiving element array is 10 μm, the line-to-line distance is:

Line-to-line Distance=20+80+2+10=40 μm

Further, calculation is performed for a case in which, with respect to the structure where the first and second charge transfer sections are provided in parallel on one side of the conventional light-receiving element array, and the shutter structure section is used on the other side where these charge transfer sections are formed. Component parts to be disposed between the light-receiving elements are two arrays of charge transfer sections, one array of read gate, one array of shutter gate, one array of gate transferring between the charge transfer sections, one array of shutter drain, element separation region, and one array of light-receiving element array. In the case where the width of the shutter gate is 4 μm, the width of the shutter drain is 2 μm, and the width of the gate transferring between the charge transfer sections is 10 μm, using the same examples of the array width on a part that overlaps with the abovementioned elements, the line-to-line distance is:

Line-to-line Distance=20+4+4+10+4+2+10=54 μm

On the other hand, in the color linear image sensor of this embodiment, the component parts existing between the line-to-line distance are two arrays of charge transfer sections, one array of read gate, a structure in which one array of shutter gate having a width substantially the same as that of the array of read gate is combined with one array of shutter gate, one array of element separation region, and one array of light-receiving element. In this embodiment, if the array of read gate is 8 μm, the structure in which one array of shutter gate having a width substantially the same as that of the read gate is combined with one array of shutter gate is 8 μm, and thus the total is 16 μm, the line-to-line distance is:

Line-to-line Distance=20+16+2+10=48 μm

These cases are applied to the formula (1) above to calculate the size of the required external memory for each case. Although the charges are transferred from both sides of the light-receiving element array, the size of the external memory, which is necessary when no shutter structure section exists, is 636000 bits. With respect to the structure where the first and second charge transfer sections are provided in parallel on one side of the light-receiving element array, the size of the external memory which is necessary when the shutter structure section is used on the other side where these charge transfer sections are provided is 814080 bits. On the other hand, the size of the external memory which is necessary in this embodiment is 737760 bits.

The required external memory has the smallest size because the shutter structure section is not provided, and, in the abovementioned color linear image sensor which does not have the shutter function, the exposure thereof cannot be adjusted. The color linear image scanner of this embodiment can have the shutter function and reduce the external memory that is sufficiently necessary.

Moreover, although no detailed explanation is provided here, a phenomenon such as color shift occurs in the color linear image sensor which performs mechanical scan in the feed direction. For example, when considering the case where exists a scan drift Y with the equal amount with respect to one scan, sum of the drift YA from a place where a first scan is performed to a place where a second scan is performed is:

$$YA = M \times Y \quad (2)$$

Here, M represents the line-to-line distance of the two light-receiving element arrays by the number of scans.)

As can be seen in the formula (2) here as well, it is necessary to reduce the line-to-line distance and the number of scans from the first scan to the second scan in order to reduce color shift. As can be understood from this formula of color shift, it is necessary to reduce the line-to-line distance as much as possible in order to achieve high speed of the color linear image sensor of this embodiment and reduction of the external memory.

As was described above in detail, in the color linear image sensor according to Embodiment 1 of the present invention, the shutter function can be securely executed while realizing high speed. Furthermore, while realizing high speed and the shutter function, increase of the line-to-line distance thereof and of the external memory can be suppressed. Specifically, the configuration is such that the shutter structure section and the read gate 2 are alternately disposed at each odd-numbered pixels and even-numbered pixels of an array of light-receiving element array, whereby the shutter function can be securely executed with respect to each pixel. Further, high speed in the output signals can be achieved with this configuration. Moreover, increase of the line-to-line distance can be controlled low while achieving high speed and a high-quality picture.

Embodiment 2 of the Invention

Figure 6:
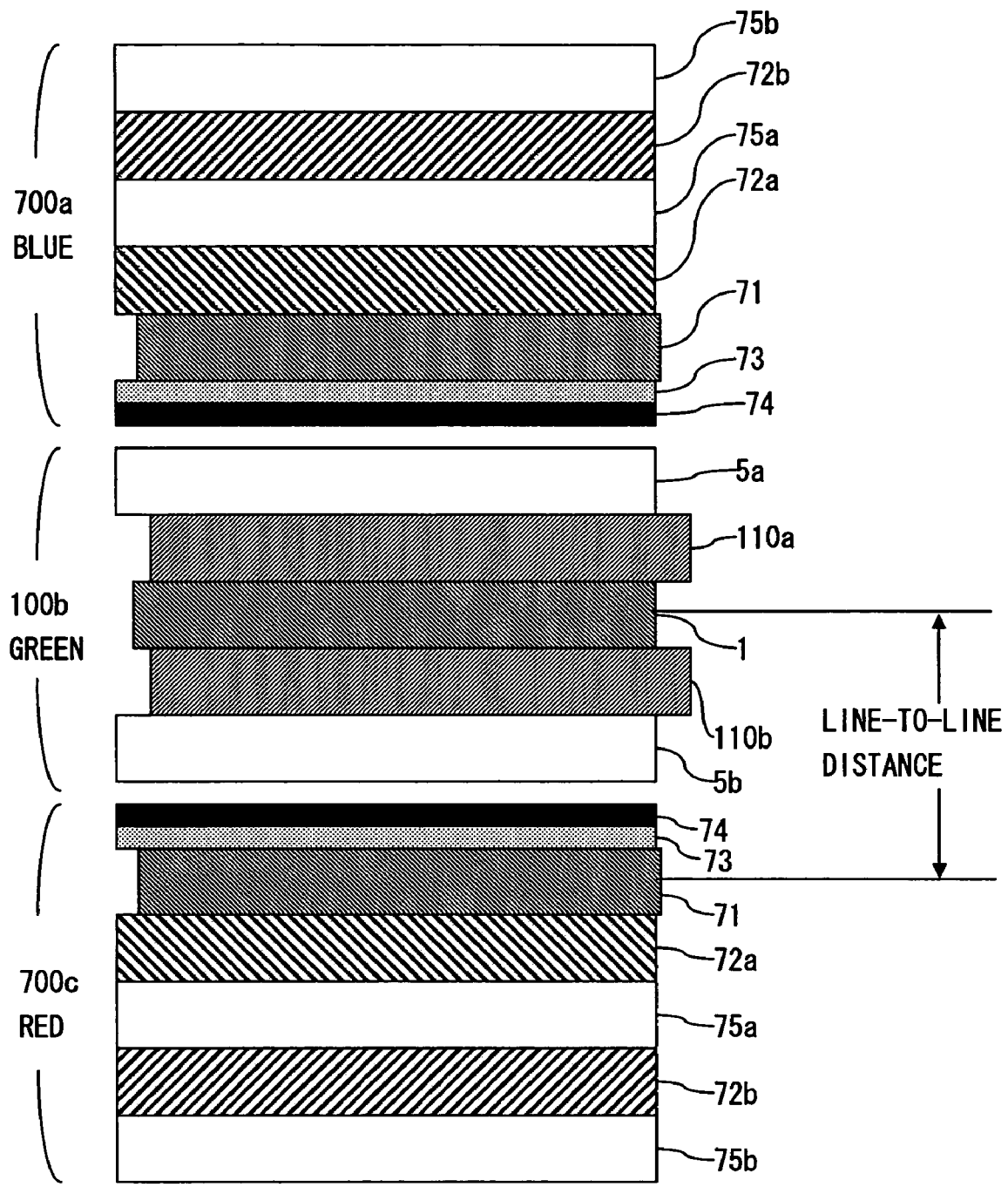
FIG. 6 shows a top view of the linear image sensor of Embodiment 2.

Embodiment 2 will now be described hereinbelow with reference to the drawings. FIG. 6 is a top view showing Embodiment 2. A characteristic of Embodiment 2 is that the line-to-line distance between the light-receiving elements is reduced by contriving the arrangement of the linear image sensor 100 shown in FIG. 1 described in detail in Embodiment 1 and a linear image sensor 700 having a structure where the first and second charge transfer sections are provided on one side of the light-receiving element array in parallel.

Figure 7:
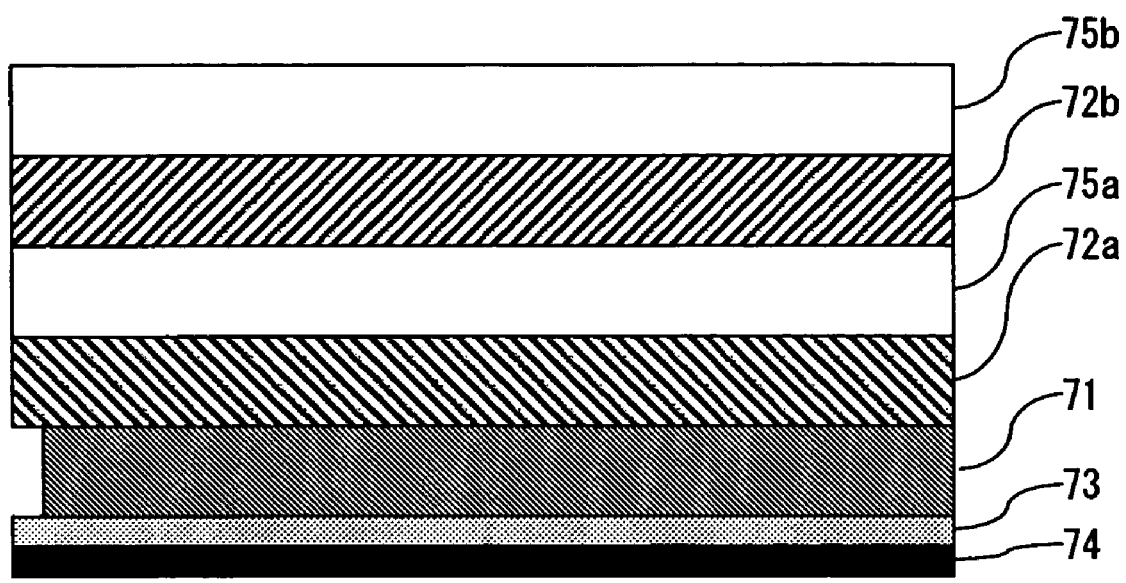
FIG. 7 shows a top view of the color linear image sensor of Embodiment 2.

The configuration of the linear image sensor 700 used in Embodiment 2 will now be described using FIG. 7. In the linear image sensor 700, a first read gate 72a, transfer gate 72b between charge transfer sections, a first charge transfer section 75a and a second charge transfer section 75b are disposed on one side of a light-receiving element array 71 (upper side of the figure). A shutter structure section (shutter gate 73 and shutter drain 74) is disposed on the other side of the light-receiving element array 71.

As shown in FIG. 6, the color linear image sensor of Embodiment 2 has a configuration in which the linear image sensors 100 and 700 corresponding to respective colors (GREEN, RED, and BLUE, for example) are arranged to form three arrays. The color linear image sensor of Embodiment 2 has one linear image sensor 100 shown in FIG. 1 and two linear image sensors 700 shown in FIG. 7.

As can be seen in FIG. 6, in the color linear image sensor of this embodiment, the first linear image sensor 100b represented in FIG. 1 is disposed in the middle of the three arrays of linear image sensors that are arranged in the vertical direction of the figure. In a second linear image sensor 700a, a shutter structure section is disposed between the light-receiving element array of the second linear image sensor 700a and the linear image sensor 100b. The first and second charge transfer sections 75a and 75b of the linear image sensor 700a are disposed in parallel on the other side of the linear image sensor 100b with respect to the light-receiving element array of the second linear image sensor 700a. In a third linear image sensor 700c on the lower side of the figure, a shutter structure section is disposed between the light-receiving element array of the third linear image sensor 700c and the linear image sensor 100b. First and second charge transfer sections of the linear image sensor 700c are disposed in parallel on the other side of the linear image sensor 100b with respect to the light-receiving element array of the third linear image sensor 700c.

In other words, in the color linear image sensor of Embodiment 2, the second and third linear image sensors 700a and 700c, which have the same configuration having on one side thereof the first and second charge transfer sections with respect to the light-receiving element array, are disposed symmetrically with the linear image sensor 100b of the structure of FIG. 1 as a center. Further, in the color linear image sensor of Embodiment 2, the two linear image sensors 700a and 700c are disposed such that the first and second charge transfer sections thereof face outside with respect to the first linear image sensor.

When having such a configuration, the configuration between the light-receiving element array of the linear image sensor 700a and the light-receiving element array of the linear image sensor 100b has the shutter structure section of the linear image sensor 700 (shutter gate and shutter drain), element separation region, charge transfer section of the linear image sensor 100b, and read gate or shutter structure section of the linear image sensor 100b. The configuration between the light-receiving element array of the linear image sensor 700c and the light-receiving element array 1 of the linear image sensor 100b is the same in the opposite order.

As to the widths of the respective partial structures, when the widths of the shutter structure section of the linear image sensor 700a is 4+4=8 µm, the element separation region 2 µm, the charge transfer section 10 µm, and the read gate or shutter structure section of the linear image sensor 100b 8 µm, considering a 10 µm width of the light-receiving element array, the line-to-line distance is:

Line-to-line Distance=10+8+4+4+2+10=38 µm

As is clear from the result of the line-to-line distance, by configuring the color linear image sensor by using the arrangement of Embodiment 2, the line-to-line distance, which is the same as that of the color linear image sensor that does not have the shutter structure section, can be obtained. Therefore, the size of the required external memory can be reduced. Further, color shift due to the line-to-line distance can be reduced.

According to the color linear image sensor of Embodiment 2 as described above in detail, the size of the external memory can be reduced while achieving high speed. The exposure based on the accumulation time can be controlled since each line is provided with the shutter structure section. Furthermore, by reducing the line-to-line distance, the color drift due thereto can be reduced, thus high quality picture can be further achieved.

Each of the embodiments above describes that the linear image sensors configuring the color linear image sensor are GREEN, RED, or BLUE; however, the types of the linear image sensors are not limited to these, and naturally numbers of linear image sensors may be provided.

It is apparent that the present invention is not limited to the above embodiment, that may be modified and changed without departing from the scope and spirit of the invention.

What is claimed is:

1. A linear image sensor, comprising:
   a read gate which reads out a signal charge of a light-receiving element;
   a shutter structure section which controls an accumulated charge of the light-receiving element;
   a first gate/shutter array in which a plurality of the read gates and of the shutter structure sections are alternately disposed;
   a second gate/shutter array in which the read gates and the shutter structure sections are alternately disposed in the order that is different from the order in the first gate/shutter array;
   a light-receiving element array which is disposed between the first and second gate/shutter arrays and in which a plurality of the light-receiving elements are arranged in line;
   a first charge transfer section which transfers a signal charge which is read out through the read gate of the first gate/shutter array; and
   a second charge transfer section which transfers a signal charge which is read out through the read gate of the second gate/shutter array.

2. The linear image sensor according to claim 1, wherein the shutter structure section has a shutter gate and a shutter drain, and controls accumulated charges of the light-receiving element array on the basis of a shutter signal provided to the shutter gate.

3. The linear image sensor according to claim 1, wherein the read gate is supplied with a read signal, the shutter structure section controls the accumulated charge in response to a shutter control signal and read signal and the read signal is different from the shutter control signal.

4. A color linear image sensor, comprising:
   a first linear image sensor, the first linear image sensor comprising,
   a first gate/shutter array in which a plurality of read gates and of shutter structure sections are alternately disposed,
   a second gate/shutter array in which the read gates and the shutter structure sections are alternately disposed in the order that is different from the order in the first gate/shutter array,
   a light-receiving element array which is disposed between the first and second gate/shutter arrays and in which a plurality of the light-receiving elements are arranged in line,
   a first charge transfer section which transfers a signal charge which is read out through the read gate of the first gate/shutter array, and a second charge transfer section which transfers a signal charge which is read out through the read gate of the second gate/shutter array; and a second linear image sensor, the second linear image sensor comprising, a third gate/shutter array in which a plurality of the read gates and of the shutter structure sections are alternately disposed, a fourth gate/shutter array in which the read gates and the shutter structure sections are alternately disposed in the order that is different from the order in the third gate/shutter array, a light-receiving element array which is disposed between the third and fourth gate/shutter arrays and in which a plurality of the light-receiving elements are arranged in line, a third charge transfer section which transfers a signal charge which is read out through the read gate of the third gate/shutter array, and a fourth charge transfer section which transfers a signal charge which is read out through the read gate of the fourth gate/shutter array;

wherein the shutter structure sections of the first linear image sensor is controlled based on a first shutter signal, and the shutter structure sections of the second linear image sensor is controlled based on a second shutter signal.

5. The color linear image sensor according to claim 4, further comprising:

a first color filter disposed over the first linear image sensor; and a second color filter disposed over the second linear image sensor.

6. The color linear image sensor according to claim 5, wherein a color of the second color filter is different from that of the first color filter.

7. The color linear image sensor according to claim 5, wherein each of the first and second shutter signals is set in association with each characteristics of the first and second color filters.

8. A color linear image sensor, comprising:

a first linear image sensor, the first linear image sensor comprising, a first gate/shutter array in which a plurality of read gates and of shutter structure sections are alternately disposed, a second gate/shutter array in which the read gates and the shutter structure sections are alternately disposed in the order that is different from the order in the first gate/shutter array, a first light-receiving element array which is disposed between the first and second gate/shutter arrays and in which a plurality of the light-receiving elements are arranged in line, a first charge transfer section which transfers a signal charge which is read out through the read gate of the first gate/shutter array, and a second charge transfer section which transfers a signal charge which is read out through the read gate of the second gate/shutter array; and a second linear image sensor, the second linear image sensor comprising, a second light-receiving element array in which a plurality of the light-receiving elements are arranged in line, a third and fourth charge transfer sections disposed at one side of the second light-receiving element array, and a shutter structure sections disposed at opposite side of the third and fourth charge transfer sections.

9. The color linear image sensor according to claim 8, wherein the shutter sections of the second linear image sensor is disposed between the first linear image sensor and the second linear image sensor.

10. The color linear image sensor according to claim 8, further comprising:

a third linear image sensor, the third linear image sensor comprising, a third light-receiving element array in which a plurality of the light-receiving elements are arranged in line, a fifth and sixth charge transfer sections disposed at one side of the third light-receiving element array, and a shutter structure sections disposed at opposite side of the fifth and sixth charge transfer sections.

11. The color linear image sensor according to claim 8, wherein the shutter structure sections of the first linear image sensor is controlled based on a first shutter signal, and the shutter structure sections of the second linear image sensor is controlled based on a second shutter signal.

12. The color linear image sensor according to claim 10, wherein the shutter structure sections of the first linear image sensor is controlled based on a first shutter signal, the shutter structure sections of the second linear image sensor is controlled based on a second shutter signal, and the shutter structure sections of the third linear image sensor is controlled based on a third shutter signal.

* * * * *